United States Patent [19]

Hodgkinson

[11] 4,366,485

[45] Dec. 28, 1982

[54] CONCENTRIC TUBE ANTENNA ENCASED IN DIELECTRIC

[75] Inventor: Alec J. Hodgkinson, Johannesburg, South Africa

[73] Assignee: Z.S. Electroniques (Proprietary) Limited, Johannesburg, South Africa

[21] Appl. No.: 204,673

[22] Filed: Nov. 5, 1980

[30] Foreign Application Priority Data

Nov. 15, 1979 [ZA] South Africa ................ 79/6143

[51] Int. Cl.$^3$ ..................... H01Q 9/26; H01Q 1/40
[52] U.S. Cl. .............................. 343/791; 343/850; 343/873
[58] Field of Search .............. 343/790, 791, 792, 850, 343/873

[56] References Cited

FOREIGN PATENT DOCUMENTS 260005 3/1927 United Kingdom .............. 343/790
643577 9/1950 United Kingdom .............. 343/790

*Primary Examiner*—Eli Lieberman
*Attorney, Agent, or Firm*—Sughrue, Mion, Zinn, Macpeak & Seas

[57] ABSTRACT

An antenna comprises a conductor having two electrically connected sections spaced apart from each other by a dielectric material, and a directional coupler connected to the feed point, the sections being connected at a position remote from the feed point.

6 Claims, 2 Drawing Figures

CONCENTRIC TUBE ANTENNA ENCASED IN DIELECTRIC

This invention relates to an antenna and more particularly to a dielectric antenna.

In accordance with this invention there is provided an antenna comprising a conductor which has at least one section thereof spaced apart and opposite to another section thereof, the area between the two sections being at least partially occupied by dielectric material, the ends of the sections remote from the feed point of the antenna being electrically connected, and there being a directional coupler connected to the feed point, the coupler being adapted to have a low attenuation in the direction of feed in use and a high attenuation of reflected waves in the reverse direction in use.

A further feature of the invention provides for the conductor to be made of two tubular sections, one being of smaller diameter than the other and being located concentrically within the other, and for the section ends to be electrically connected by a radially located bolt through the wall of each section.

Preferably the area between the section walls is completely filled with dielectric material; the innermost section is also preferably filled with dielectric material and the outer wall of the outer tube has a coating of dielectric material.

Preferred embodiments of the invention are described below by way of example and with reference to the accompanying drawings in which.

Figure 1:
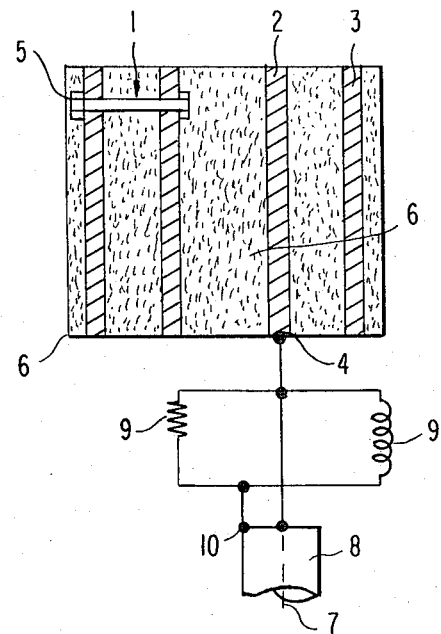
FIG. 1 is a diagrammatic view of an aerial and tuning circuit.

Referring to FIG. 1, a conductor 1 comprises two tubular sections 2 and 3, the section 2 being of smaller diameter than section 3 and concentrically located therein.

One end of the conductor, being the end remote from the feed point 4 thereof, has a bolt 5 radially through the two sections thus connecting them electrically. The whole conductor unit 1 is encapsulated in a dielectric material 6. Preferably the material is a flow free impregnated fibreglass cloth or suitable polypropylene.

The main conductor 1 is connected to the live lead 7 of a coaxial cable 8, and to one end of a parallel RL circuit 9, the other end of which is taken to earth on the co-axial cable at 10.

In use, the circuit 9 is designed to tune the antenna to the desired frequency and adjust the bandwidth.

Figure 2:
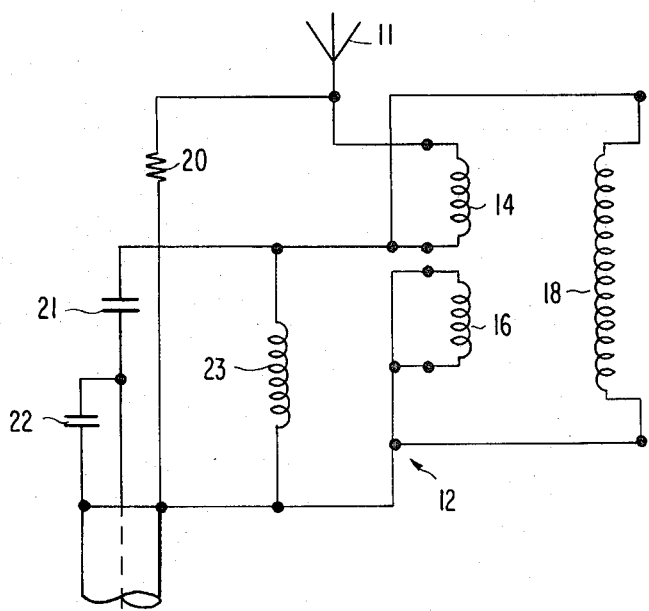
FIG. 2 is a diagrammatic view of an alternative tuning circuit.

FIG. 2 shows a more sophisticated circuit for tuning as well as input impedance stabilization.

The input impedance stabilization is achieved by feeding the antenna 11 through a three port circulator, indicated generally at 12.

In the feed direction the circulator allows energy flow with only limited attenuation, but in the reverse direction attentuation is high.

This results in high attenuation of reflected waves which may cause poor aerial efficiency when the antenna is off its resonant frequency.

In order to reduce the feeder effect the circulator is also arranged to decouple the energy from the coax braid.

The circulator may be constituted by a conventional three-port circulator having three windings 14, 16 and 18. The windings 14, 16 and 18 are arranged and phased such that there is a small amount of attenuation in the feed direction but a much greater amount of attenuation in the reverse direction. A considerable variety of circuit configurations can be used to achieve this effect. What is required is that the currents in the feed direction induce currents in the windings which are in phase, while currents in the reverse direction induce current that are out of phase. Resistor 20, capacitors 21 and 22 and inductor 23 constitute a matching circuit.

It has been found in practice that the antenna has a shorter physical length than its conventional whip antenna counterpart, but maintains substantially the same efficiency.

When the circulator network of FIG. 2 is used, the bandwidth is increased and an efficiency of approximately 80% is achieved provided the lowest frequency radiated or received has not less than one quarter of the wavelength for which the antenna is designed. Furthermore, an earth plane of the antenna is not necessary.

The antenna is entirely passive and requires no tuning throughout its operating frequency range, may be hand held owing to its lightweight construction and limited length, and is also therefore easily transportable.

What I claim as new and desire to secure by Letters Patent is:

1. An antenna comprising: a conductor formed by two tubular sections, one of said tubular sections being of smaller diameter than the other and being located concentrically within the other, the ends of the two tubular sections being electrically connected at one pair of ends thereof remote from the feed point of the antenna, and there being a directional coupler connected to the feed point, the coupler being adapted to have a low attenuation in the direction of feed and a high attenuation of reflected waves in the reverse direction.

2. An antenna as claimed in claim 1 in which the electrical connection comprises a radially located bolt through the tubular section walls.

3. An antenna as claimed in claim 1 or 2 in which the space between the sections is filled with dielectric material.

4. An antenna as claimed in claim 1 or 2 in which the space between the sections, and the tubular space within the innermost section, is filled with dielectric material.

5. An antenna as claimed in claim 1 in which the outer wall of the outer tubular section has a coating of dielectric material.

6. An antenna as claimed in claim 5 in which the dielectric material is a polypropylene plastics material.